(12) United States Patent
Nagai et al.

(10) Patent No.: US 7,423,284 B2
(45) Date of Patent: Sep. 9, 2008

(54) LIGHT EMITTING DEVICE, METHOD FOR MAKING THE SAME, AND NITRIDE SEMICONDUCTOR SUBSTRATE

(75) Inventors: Youichi Nagai, Osaka (JP); Koji Katayama, Itami (JP); Hiroyuki Kitabayashi, Itami (JP)

(73) Assignee: Sumitomo Electric Industries, Ltd. (JP)

( * ) Notice: Subject to any disclaimer, the term of this patent is extended or adjusted under 35 U.S.C. 154(b) by 18 days.

(21) Appl. No.: 11/362,407

(22) Filed: Feb. 24, 2006

(65) Prior Publication Data

US 2006/0273334 A1   Dec. 7, 2006

(30) Foreign Application Priority Data

May 17, 2005   (JP)   ............................. 2005-144110

(51) Int. Cl.
| | |
|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/08 | (2006.01) |
| H01L 39/22 | (2006.01) |
| H01L 27/15 | (2006.01) |
| H01L 29/267 | (2006.01) |
| H01L 31/12 | (2006.01) |
| H01L 33/00 | (2006.01) |
| H01L 29/22 | (2006.01) |

(52) U.S. Cl. .............................. 257/21; 257/35; 257/81; 257/82; 257/94; 257/95; 257/98; 257/99; 257/100; 257/103; 257/117; 257/118

(58) Field of Classification Search .................. 257/35, 257/98–100, 21, 81–82, 84–95, 103, 117–118

See application file for complete search history.

(56) References Cited

U.S. PATENT DOCUMENTS 5,814,839 A * 9/1998 Hosoba ........................ 257/96

(Continued)

FOREIGN PATENT DOCUMENTS

JP   11-191636   7/1999

(Continued)

OTHER PUBLICATIONS

D.W. Kim, et al, Highly efficient vertical laser-liftoff GaN-based light-emitting diodes formed by optimization of the cathode structure, Applied Physics Letters 86, 052108, 2005.

*Primary Examiner*—Ida M Soward
(74) *Attorney, Agent, or Firm*—Darby & Darby

(57) ABSTRACT

A light-emitting device includes a GaN substrate; a n-type $Al_xGa_{1-x}N$ layer on a first main surface side of the GaN substrate; a p-type $Al_xGa_{1-x}N$ layer positioned further away from the GaN substrate compared to the n-type $Al_xGa_{1-x}N$ layer; a multi-quantum well (MQW) positioned between the n-type $Al_xGa_{1-x}N$ layer and the p-type $Al_xGa_{1-x}N$ layer. In this light-emitting device, the p-type $Al_xGa_{1-x}N$ layer side is down-mounted and light is emitted from the second main surface, which is the main surface of the GaN substrate opposite from the first main surface. hemispherical projections are formed on the second main surface of the GaN substrate.

4 Claims, 8 Drawing Sheets

U.S. PATENT DOCUMENTS

| | | | |
|---|---|---|---|
| 6,091,083 A * | 7/2000 | Hata et al. | 257/79 |
| 6,861,672 B2 * | 3/2005 | Kamiyama et al. | 257/79 |
| 6,870,191 B2 * | 3/2005 | Niki et al. | 257/79 |
| 6,891,201 B2 * | 5/2005 | Tsuda et al. | 257/88 |
| 6,900,457 B2 * | 5/2005 | Toguchi et al. | 257/40 |
| 6,956,245 B2 * | 10/2005 | Senda et al. | 257/94 |
| 6,969,946 B2 * | 11/2005 | Steranka et al. | 313/114 |
| 7,009,210 B2 * | 3/2006 | Sarathy et al. | 257/98 |
| 7,015,516 B2 * | 3/2006 | Eliashevich et al. | 257/103 |
| 7,102,175 B2 * | 9/2006 | Orita | 257/97 |
| 2002/0030194 A1 * | 3/2002 | Camras et al. | 257/98 |
| 2003/0164505 A1 * | 9/2003 | Streubel et al. | 257/80 |
| 2003/0178626 A1 * | 9/2003 | Sugiyama et al. | 257/79 |
| 2004/0012958 A1 * | 1/2004 | Hashimoto et al. | 362/241 |
| 2004/0201025 A1 * | 10/2004 | Barnett et al. | 257/79 |
| 2005/0062060 A1 * | 3/2005 | Nagai et al. | 257/100 |
| 2005/0189558 A1 * | 9/2005 | Liu | 257/100 |
| 2006/0060888 A1 * | 3/2006 | Kim et al. | 257/200 |

FOREIGN PATENT DOCUMENTS

JP    2004-056088 A    2/2004

* cited by examiner

LIGHT EMITTING DEVICE, METHOD FOR MAKING THE SAME, AND NITRIDE SEMICONDUCTOR SUBSTRATE

INCORPORATION BY REFERENCE

The present application claims priority under 35 U.S.C. §119 to Japanese Patent Application No. 2005-144110 filed on May 17, 2005 in the Japanese language, which is hereby incorporated by reference in its entirety.

BACKGROUND OF THE INVENTION

1. Field of the Invention

The present invention relates to a light-emitting device, a method for making the same, and a nitride semiconductor substrate. More specifically, the present invention relates to a light-emitting device formed from a nitride semiconductor, a method for making the same, and a nitride semiconductor substrate. In the present invention, a "light-emitting device" may refer to a semiconductor element formed essentially from a nitride semiconductor substrate and a semiconductor layer laminated thereon, or may refer solely to a semiconductor chip, or may refer solely to a device sealed in resin with a semiconductor chip mounted in a mounting part. Furthermore, the term may also be used with both meanings at the same time. Also, a semiconductor chip may be referred to solely as a "chip". Also, in a chip, a substrate and an epitaxial layer formed thereon may be referred to simply as a "substrate".

2. Description of the Background Art

Currently, white light-emitting diodes (LED) are frequently used for illumination and compact electronic devices such as portable information terminals. However, there is the potential that they may be used for illumination in large spaces or over large areas in the future. To make it possible to use LEDs for illumination of large spaces and large areas, the light output of LEDs must be increased.

One method for increasing the light output of an LED is to efficiently output the light generated inside the LED to the outside, i.e., to improve the light extraction efficiency. Examples of conventional technologies for improving light extraction efficiency include: a light-emitting device with a substrate formed from sapphire or the like wherein a light-reflecting surface with a convexo-concave shape is formed using blasting on a back surface opposite from a surface on which a nitride semiconductor layer is formed (e.g., see Japanese Laid-Open Patent Publication Number 2004-56088); a light-emitting device wherein a curved shape that, combined with groove formation and abrasion, can act like a lens is formed on the back surface described above of a substrate formed from sapphire or the like; and a gallium nitride (GaN) device laminated on a sapphire substrate, an electrode being formed on the n-GaN layer and a hemispherical projection with a diameter of 0.5-1 micron formed on the n-GaN layer surface by etching the n-GaN layer surface (e.g., the non-patent document: D. W. Kim, and three others, "Highly efficient vertical laser-liftoff GaN-based light-emitting diodes formed by optimization of the cathode structure", Applied Physics Letters 86, 052108 (2005)).

In the light-emitting device disclosed in Japanese Laid-Open Patent Publication Number 2004-56088, blasting is performed to form a convexo-concave shape, but accurately controlling the shape of the concave/convex shape when this method is used is difficult. Also, in Japanese Laid-Open Patent Publication Number 2004-56088, dicer and laser processing are also given as examples for methods forming a reflective surface, but forming shapes such as hemispherical surfaces is difficult with these methods.

Also, in the specification of Japanese Patent Number 3362836, a curved-surface shape is formed by forming a groove using a dicer or laser and then applying abrasion, but since this method combines a dicer step and an abrasion step, the number of production steps is increased compared to simply using a dicer by itself. As a result, the production cost of the light-emitting device is increased.

In the non-patent document described above, a hemispherical projection is formed by etching the surface of a GaN layer (n-GaN layer) laminated on a sapphire substrate so that the diameter of the formed projection is limited by the thickness of the laminated GaN layer. More specifically, the GaN layer must be laminated with adequate thickness in order to form a projection with a larger diameter, but the laminating step for a thicker GaN layer requires more time, resulting in increased production costs for the light-emitting device.

The object of the present invention is to overcome these problems and to provide a light-emitting device, method for making the same, and a nitride semiconductor substrate that can be used for making the same wherein light extraction efficiency can be improved without increasing production costs.

SUMMARY OF THE INVENTION

A light-emitting device according to the present invention is a light-emitting device including: a nitride semiconductor substrate; an n-type nitride semiconductor layer disposed on a first main surface side of the nitride semiconductor substrate; a p-type nitride semiconductor layer positioned further away from the nitride semiconductor substrate compared to the n-type nitride semiconductor layer; and a light-emitting layer positioned between the n-type nitride semiconductor layer and the p-type nitride semiconductor layer. In this light-emitting device, the p-type nitride semiconductor layer side is down-mounted, and light is emitted from a second main surface of the nitride semiconductor substrate, which is the main surface opposite from the first main surface. Hemispherical projections are formed on the second main surface of the nitride semiconductor substrate.

In this structure, hemispherical projections are formed on the second main surface 1a, which is the light-emitting surface of the nitride semiconductor substrate, so that the projections act as lenses to allow efficient extraction of light perpendicular to the second main surface. As a result, it is possible to improve light usage efficiency in the light-emitting device compared to when no projections are formed, when only a non-specular finish is applied to the second main surface using a KOH solution or the like, or a groove is formed through dicing or the like on the second main surface.

A method for making a light-emitting device equipped with a nitride semiconductor substrate according to the present invention includes: a step for preparing a nitride semiconductor substrate; and a step for forming hemispherical projections. In the step for forming hemispherical projections, hemispherical projections are formed through the removal of sections of the second main surface by performing reactive ion etching on a second main surface of the nitride semiconductor substrate, which is opposite from a first main surface on which a light-emitting layer is formed.

As a result, the projections can be formed using reactive ion etching without requiring dicing or abrasion or the like. This makes it possible to simplify the production steps of the light-emitting device compared to performing dicing or the like, thus allowing the light-emitting device of the present invention to be made at low cost.

In the nitride semiconductor substrate of the present invention, hemispherical projections are formed on one main surface. When this nitride semiconductor substrate is used to make a light-emitting device, and the surface on which the projections are formed is used as the light-extraction surface of the light-emitting device, it is possible to make a light-emitting device with high light extraction efficiency compared to when a substrate with no projections is used.

The nitride semiconductor "substrate" refers to a plate-shaped object with enough thickness to allow independent carrying and is distinguished from "films" and "layers" that do not keep their own shapes independently during carrying.

With the present invention, hemispherical projections are formed on a second main surface of a nitride semiconductor substrate so that light extraction efficiency can be improved in a light-emitting device that uses this nitride semiconductor substrate.

BRIEF DESCRIPTION OF THE DRAWINGS

FIG. 7 is to be obtained from the wafer.

DETAILED DESCRIPTION OF THE INVENTION

Next, using the figures, embodiments and examples of the present invention will be described. In the figures below, like or associated elements are assigned like numerals and their descriptions are not repeated.

First Embodiment

Figure 1:
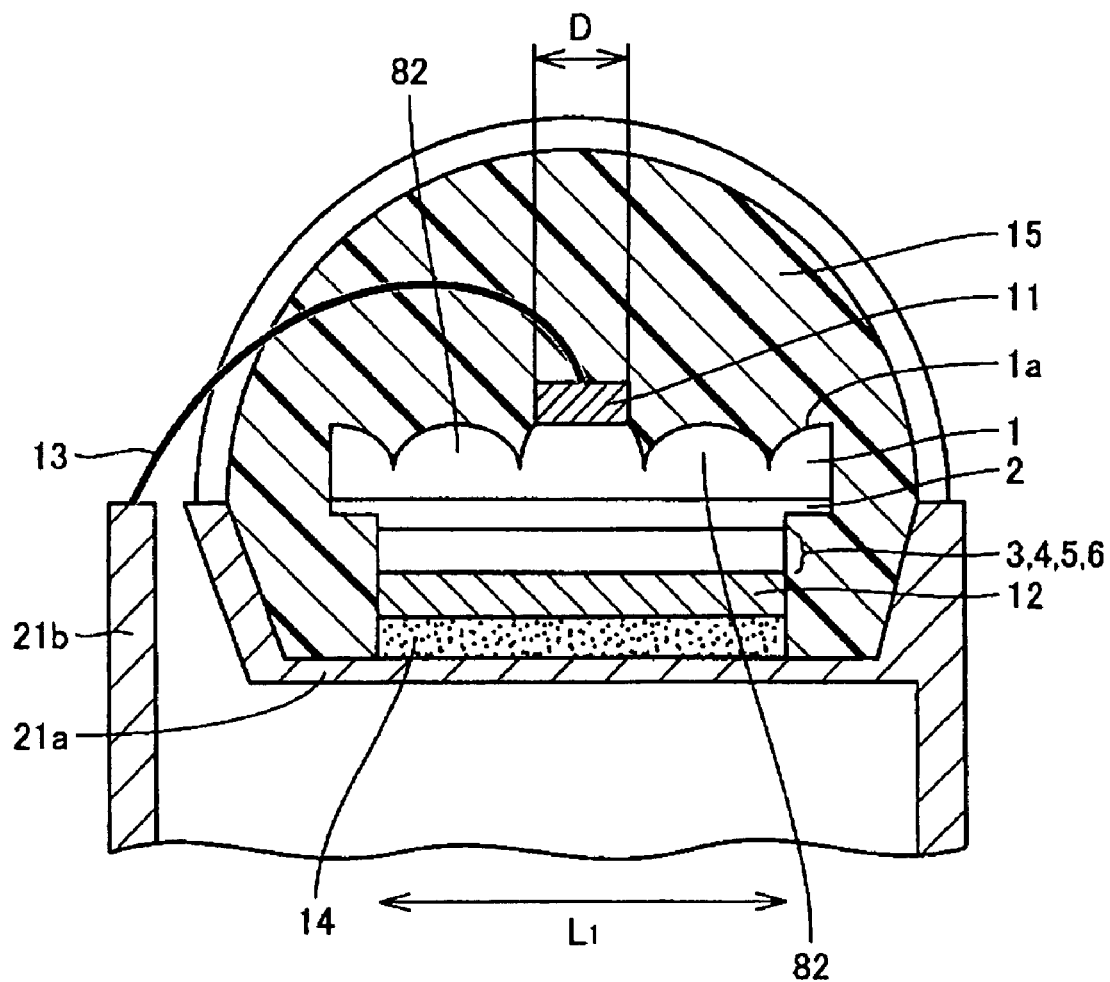
FIG. 1 is a drawing showing a first embodiment of an LED serving as a light-emitting device according to the present invention.
Figure 2:
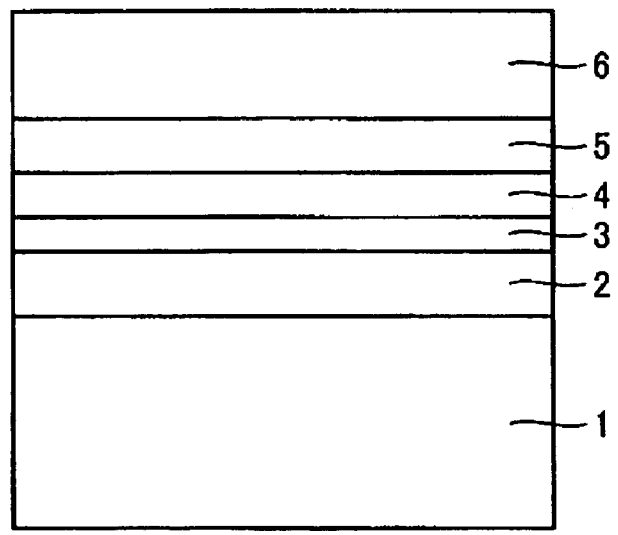
FIG. 2 is a drawing showing a layered structure containing a light-emitting layer from the LED from FIG. 1.

FIG. 1 shows a first embodiment of an LED serving as a light-emitting device according to the present invention. FIG. 2 shows a layered structure containing a light-emitting layer from the LED in FIG. 1. The first embodiment of an LED according to the present invention will be described, with references to FIG. 1 and FIG. 2.

As shown in FIG. 1, a p-electrode 12 and a layered structure containing a light-emitting layer, which will be described in detail later, and the like are formed on a first main surface side of a GaN substrate 1. In this embodiment, the p-electrode 12 is down-mounted on a lead-frame mount 21a using a conductive adhesive 14.

A second main surface 1a of the GaN substrate 1 is a surface that emits light from the light-emitting layer, and a n-electrode 11 is disposed on this surface. Multiple hemispherical projections 82 are formed using reactive ion etching (RIE) on the second main surface 1a. The n-electrode 11 is disposed at roughly the center of the second main surface 1a so that it does not cover the entire second main surface. The n-electrode 11 is disposed so that it covers the apex of one of the projections 82. Also, the n-electrode 11 can be disposed so that it covers one of the projections 82 entirely, or it can be disposed so that it covers multiple projections 82. However, it is important that there is a high proportion that is not covered by the n-electrode 11. If the opening ratio is high, the light that is blocked due to the n-electrode 11 is reduced and the emission efficiency of the light emitted outside is increased.

The n-electrode 11 is electrically connected to the lead 21b by a wire 13. The wire 13 and the layered structure described above are sealed with an epoxy-based resin 15 serving as a sealing member. In the structure described above, FIG. 2 shows a detail of the layered structure from the GaN substrate 1 to the p-electrode 12. In FIG. 2, the layered structure in FIG. 1 is vertically inverted.

As shown in FIG. 2, an n-type GaN epitaxial layer 2 is formed on the GaN substrate 1 and an n-type $Al_xGa_{1-x}N$ layer 3 is formed thereon. On this is formed a multi-quantum well (MQW) 4 formed from an $Al_xGa_{1-x}N$ layer and an $Al_xIn_yGa_{1-x-y}N$ layer. A p-type $Al_xGa_{1-x}N$ layer 5 is disposed so that the multi-quantum well 4 is interposed between it and the n-type $Al_xGa_{1-x}N$ layer 3. Also, a p-type GaN layer 6 is disposed on the p-type $Al_xGa_{1-x}N$ layer 5. In the structure described above, light is emitted at the multi-quantum well 4. Also, as shown in FIG. 1, the p-electrode 12 is formed and down-mounted on the p-type GaN layer 6 so that it covers the entire upper surface of the p-type GaN layer 6.

Figure 3:
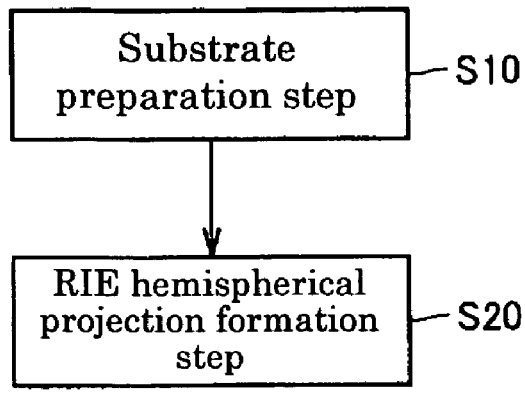
FIG. 3 is a flowchart showing a method for making a chip used in the LED shown in FIG. 1 and FIG. 2.
Figure 4:
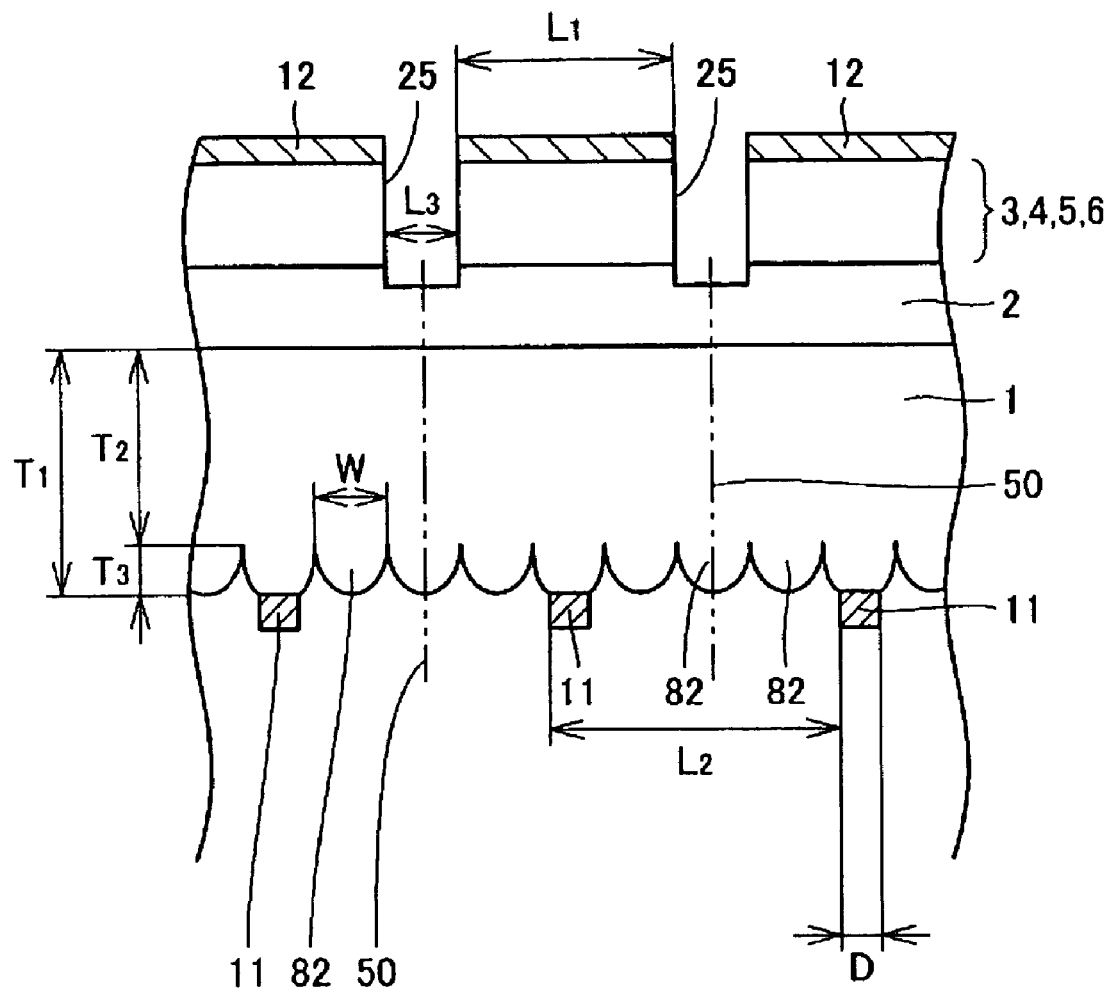
FIG. 4 is a drawing showing a state of a wafer when a chip having the structure shown in FIG. 2 is to be taken from the wafer.
Figure 5:
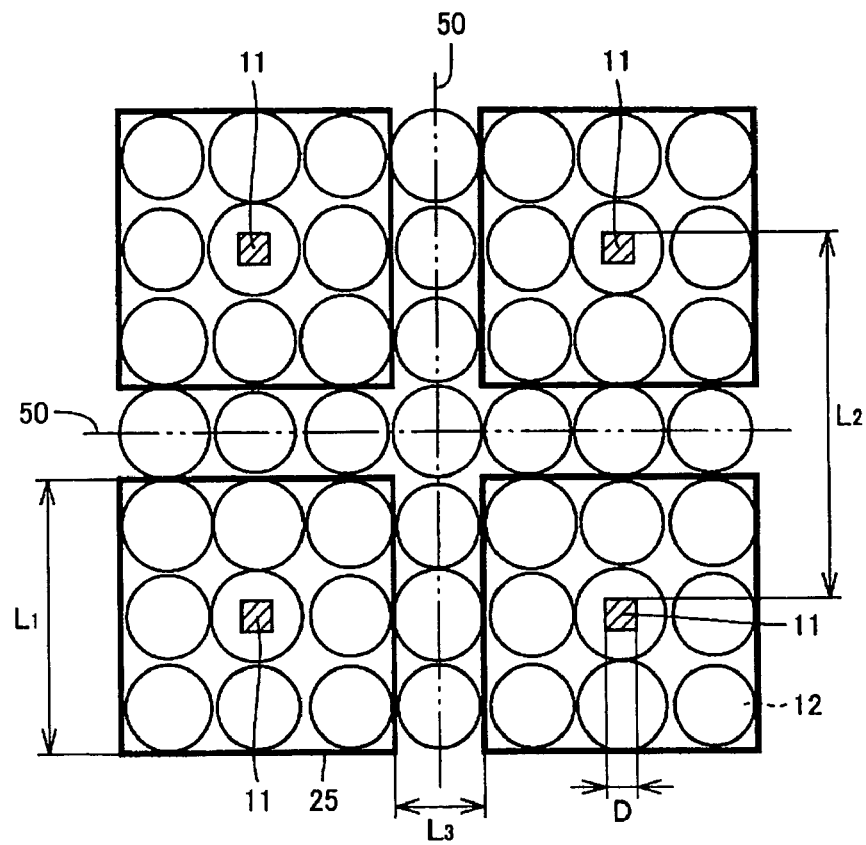
FIG. 5 is a drawing showing the arrangement of electrodes shown in FIG. 4.

Next, a method for making the LED shown in FIG. 1 and FIG. 2 will be described briefly, with references to FIG. 3 through FIG. 5. FIG. 3 is a flowchart showing a method for making a chip used in the LED shown in FIG. 1 and FIG. 2. FIG. 4 shows the state of a wafer when a chip having the structure shown in FIG. 2 is to be taken from the wafer. FIG. 5 is a drawing showing the arrangement of the electrodes shown in FIG. 4.

First, a substrate preparation step (S10) shown in FIG. 3 is performed. More specifically, a GaN substrate is prepared first. Then, a film-forming method such as MOCVD (metal organic chemical vapor deposition) is used on the first main surface of the GaN substrate to form the following layered structure: (an Si-doped n-type GaN layer/an Si-doped n-type $Al_{0.2}Ga_{0.8}N$ layer being a clad layer/an MQW (multi-quantum well) formed from multiple two-layer structures consisting of a GaN layer and an $In_{0.15}Ga_{0.85}N$ layer/an Mg-doped p-type $Al_{0.2}Ga_{0.8}N$ layer being a clad layer/an Mg-doped p-type GaN layer). Next, the wafer can be activated to lower the resistance of the Mg-doped p-type layer. The wafer is etched with a Cl-based gas from the Mg-doped p-type layer side to the Si-doped n-type layer using photolithography and RIE (reactive ion etching). Element separation grooves 25 are formed from this etching as shown in FIG. 4, and the elements are separated.

Next, photolithography, vapor deposition, and lift-off are performed on the back N surface, which is the second main surface (main surface) of the GaN substrate, to form the n-electrodes 11, which have a square shape when seen from above, at the chip centers at a predetermined pitch (a distance L2) (see FIG. 4 and FIG. 5). The n-electrode 11 can be formed as a layered structure formed, starting from the bottom layer in contact with the GaN substrate, from (Ti layer/Al layer/Ti layer/Au layer). The GaN substrate is then heated in a nitrogen ($N_2$) atmosphere in order to have the contact resistance between the n-electrode 11 and the back surface of the GaN substrate be a predetermined value.

Next, a conductor layer is formed in contact with the p-type GaN layer and with a predetermined thickness to form the p-electrode. For example, the conductor layer can be formed by forming an Ni layer with a predetermined thickness so that it is in contact with the GaN layer and forming an Au layer with a predetermined thickness over the entire surface thereof (see FIG. 4 and FIG. 5). In this case, in order to have the contact resistance between the p-electrode and the p-type GaN layer be a predetermined value, the GaN substrate can be heated in an inert gas atmosphere.

Next, a step for forming hemispherical projections using RIE (S20) shown in FIG. 3 is performed. More specifically, RIE is performed on the back surface (N surface) of the GaN substrate to form hemispherical projections 82. The reactive gas to be used in the RIE can be chlorine gas (Cl gas) or the like. Since the outer perimeter section of the region of the N surface on which the n-electrode 11 is formed is partially removed by the RIE operation, a projection with a flat top surface is formed below the n-electrode 11. The n-electrode 11 is disposed on the top surface of the projection. Also, the RIE operation forms hemispherical projections 82 in the regions of the N surface other than the regions at which the n-electrodes 11 are formed. The width W (see FIG. 4) of the projections 82 is approximately twice the height of the projections 82. The height of the projections 82 is at least 0.2 microns and no more than 100 microns. Also, it would be possible for the RIE hemispherical projection step (S20) to be performed before the step for forming the n-electrodes 11 described above.

Then, as shown in FIG. 4 and FIG. 5, scribing is performed so that chip boundaries 50 appear as side surfaces and the resulting chips form light-emitting devices. Referring to FIG. 1, the chip is mounted so that the p-type GaN layer side of the chip is in contact with the mounting section 21a of the lead frame, resulting in a light-emitting device. The conductive adhesive 14 applied to the mounting section secures the light-emitting device and the mount and provides continuity. Then, after the n-electrode 11 and a lead section of the lead frame are connected by wire bonding, the epoxy-based resin 15 seals the structure in resin so that a lamp is formed from the light-emitting device. Also, in order to improve dissipation of heat from the light-emitting device, mounting can be performed so that the entire surface of the p-type GaN layer of the light-emitting device comes into contact with the mounting section. Also, an Ag-based material, which has good heat conductivity, can be used for the conductive adhesive 14, and a CuW-based material, which has good heat conductivity, can be used for the lead frame.

Figure 6:
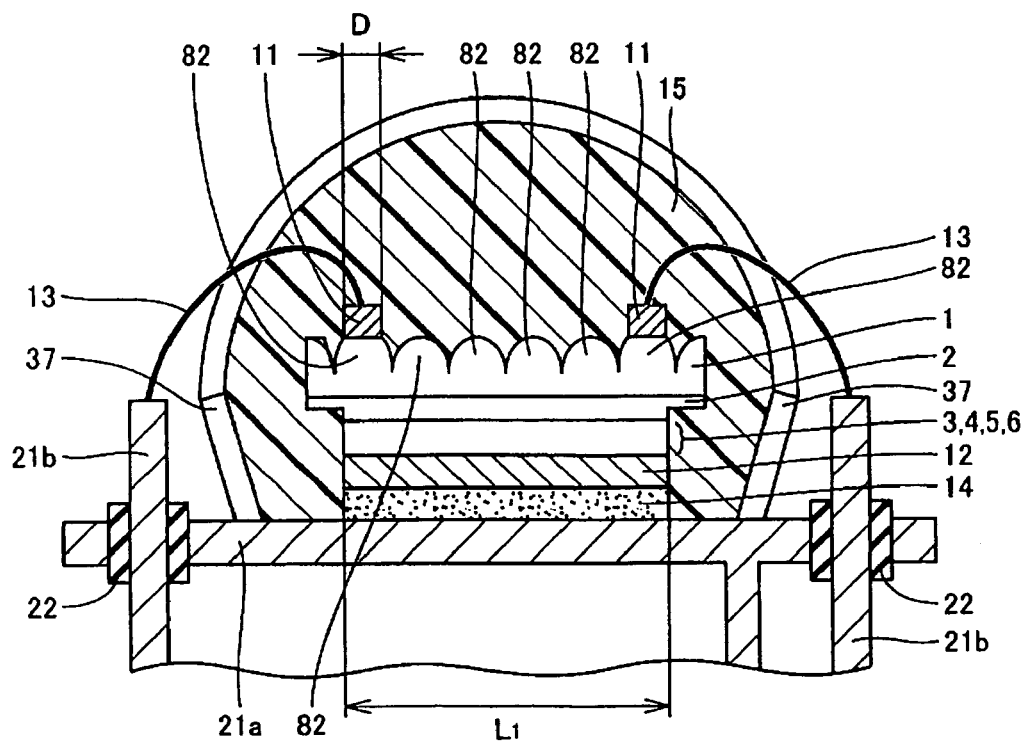
FIG. 6 is a drawing showing an alternative example of the first embodiment of an LED according to the present invention as shown in FIG. 1 through FIG. 5.
Figure 7:
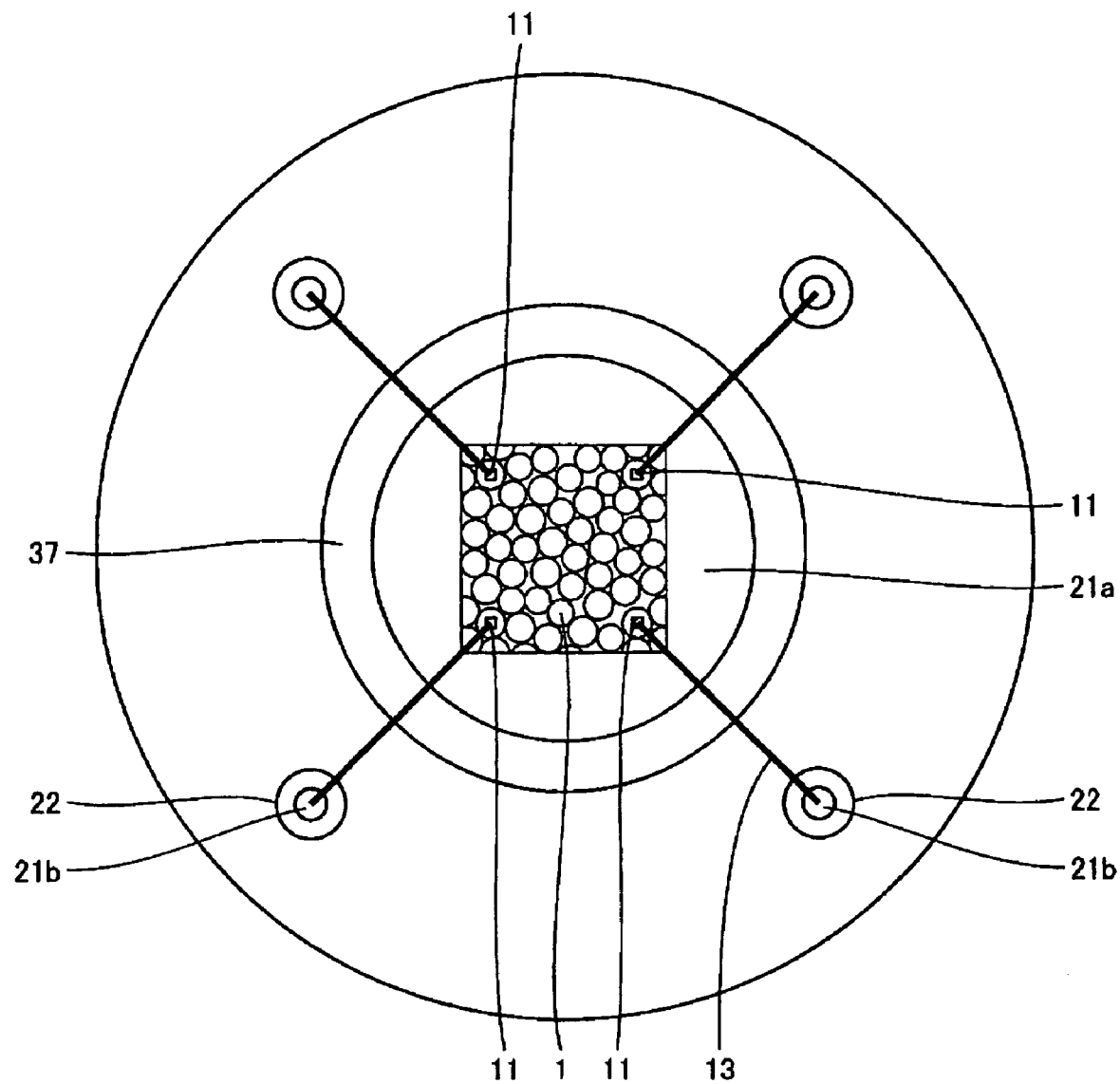
FIG. 7 is a plan drawing showing the LED from FIG. 6.

FIG. 6 shows an alternative example of the first embodiment of an LED according to the present invention shown in FIG. 1 through FIG. 5. FIG. 7 is a drawing showing the shape of the LED from FIG. 6 when seen from above. An alternative example of the first embodiment of an LED according to the present invention will be described, with references to FIG. 6 and FIG. 7.

The LED shown in FIG. 6 and FIG. 7 have essentially the same structure as the LED shown in FIG. 1 and FIG. 2, except that the n-electrodes 11 are disposed in the vicinity of the four corners of the GaN substrate. Also, in the LED shown in FIG. 6 and FIG. 7, a reflective cup 37 is disposed surrounding the mounted semiconductor chip.

Figure 8:
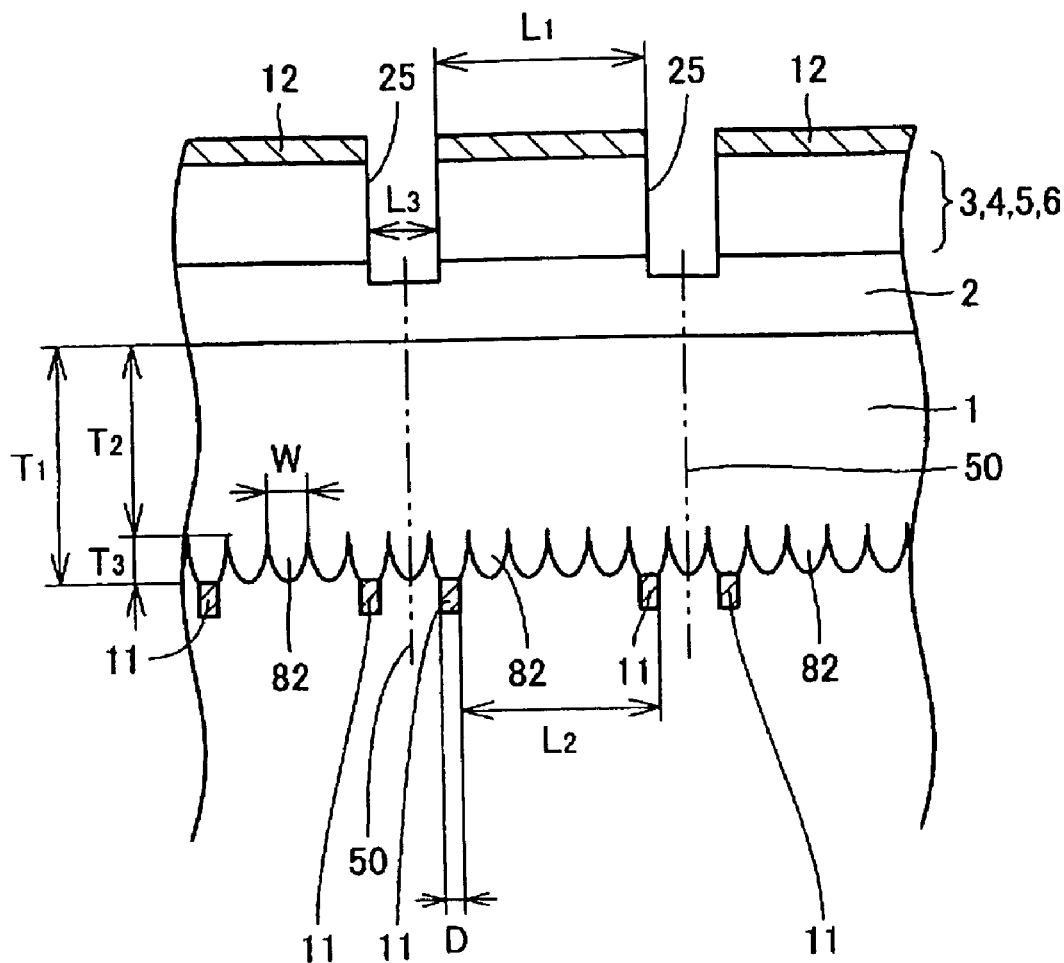
FIG. 8 is a drawing showing the state of a wafer when a chip having a layered structure used in the LED shown in FIG. 6

The method for making the LED shown in FIG. 6 and FIG. 7 is essentially the same as the method for making the LED shown in FIG. 1 and FIG. 2. FIG. 8 shows the state of a wafer when a chip with a layered structure used in the LED shown in FIG. 6 and FIG. 7 is to be taken. In this case, since each chip has a greater number of the n-electrodes 11, it would be preferable for the area of each n-electrode 11 to be smaller than the area of the n-electrode 11 of the LED shown in FIG. 1 and FIG. 2.

Second Embodiment

Figure 9:
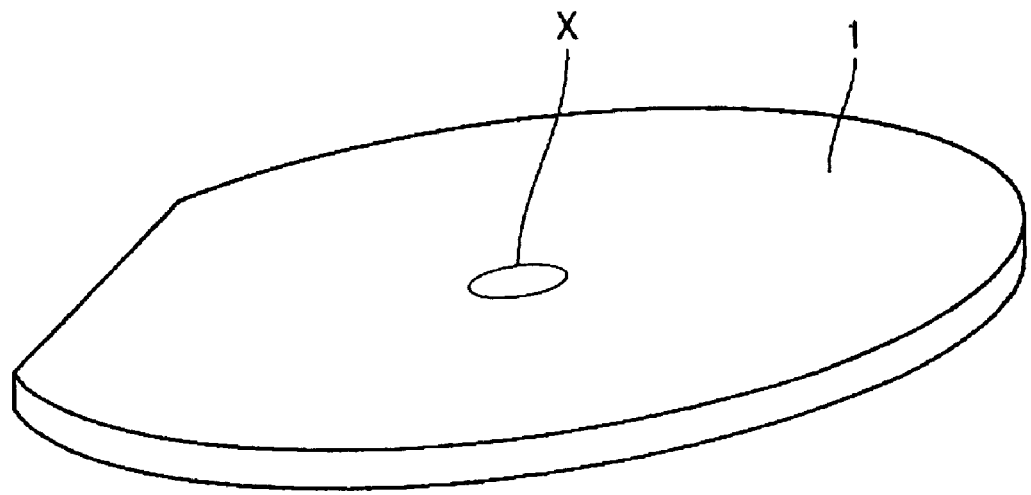
FIG. 9 is a simplified drawing showing a second embodiment of a GaN substrate according to the present invention including multiple regions that will form chips used in the light-emitting device of the present invention.
Figure 10:
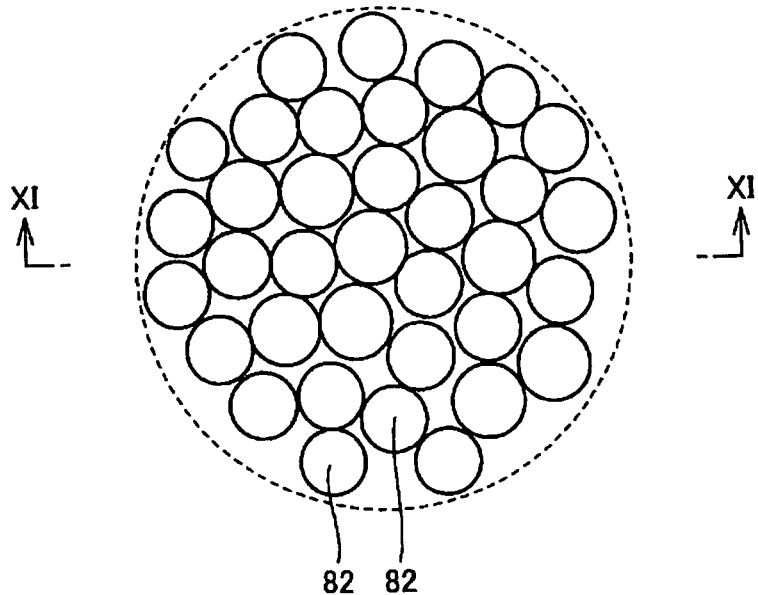
FIG. 10 is a simplified detail plan drawing of a region X shown in FIG. 9.
Figure 11:
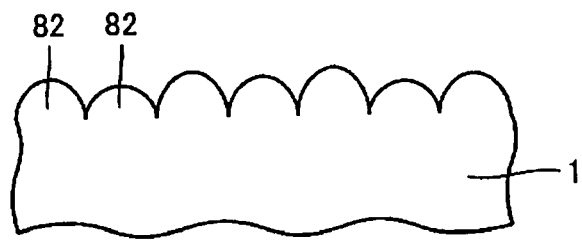
FIG. 11 is a simplified cross-section drawing along the XI-XI line segment in FIG. 10.

In the first embodiment described above, chips obtained by scribing the GaN substrate 1 are mounted in lead frames to form light-emitting devices. However, instead of separating the GaN substrate 1 into chips to form light-emitting devices, there may be cases when handling is made easier by working with a substrate on which the RIE hemispherical projection formation step (S20) has been performed to form the hemispherical projections 82 on the GaN substrate 1. FIG. 9 is a simplified drawing showing a second embodiment of a GaN substrate according to the present invention containing multiple regions for chips that will form light-emitting devices. FIG. 10 is a simplified detail drawing of a region X shown in FIG. 9. FIG. 11 is a simplified cross-section drawing along a line segment XI-XI from FIG. 10. As shown in FIG. 9 through FIG. 11, multiple hemispherical projections 82 are formed on the second main surface 1a, which is one of the main surfaces of the GaN substrate 1. The handling of multiple chips is made easier by handling them in the form where the multiple chips are on the GaN substrate 1 before they have been separated.

First Example

In order to study the advantages of the light-emitting device of the present invention, the samples described below were prepared, and blue light output values were measured for predetermined currents. First, the prepared samples will be described.

(First invention sample): The LED of the first invention sample is equipped with essentially the same structure as the LED shown in FIG. 1 and FIG. 2. The method for making the LED of the first invention sample is essentially similar to the method for making the light-emitting device described with reference to FIG. 3 through FIG. 5. More specifically, the following operations are performed.

(S1-1) A GaN off-substrate with a 0.5 deg offset from the c-plane was used. The oxygen concentration of the substrate was $5E18/cm^3$, the dislocation density was $1E7/cm^2$, and the thickness was 400 microns.

(S1-2) MOCVD (metal organic chemical vapor deposition) was used to form the layered structure on the Ga surface, which is the first main surface, of the GaN substrate: (Si-doped n-type GaN layer/Si-doped n-type $Al_{0.2}Ga_{0.8}N$ layer being a clad layer/an MQW (multi-quantum well) formed by stacking three two-layer structures consisting of a GaN layer and an $In_{0.15}Ga_{0.85}N$ layer/an Mg-doped p-type $Al_{0.2}Ga_{0.8}N$ layer being a clad layer/an Mg-doped p-type GaN layer)

(S1-3) The light emission wavelength was 450 nm.

(S1-4) The wafer was activated to reduce the resistance of the Mg-doped p-type layer. Carrier densities were determined by Hall measurement and was $5E17/cm^3$ for the Mg-doped p-type $Al_{0.2}Ga_{0.8}N$ layer and $1E18/cm^3$ for the Mg-doped p-type GaN layer.

(S1-5) Photolithography and RIE (reactive ion etching) were performed on the wafer using a Cl-based gas to etch from the Mg-doped p-type layer side to the Si-doped n-type layer.

As a result of this etching, element separation grooves 25 were formed as shown in FIG. 4, and the elements were separated. The width L3 of the element separation grooves was 100 microns.

(S1-6) Photolithography, vapor deposition, and lift-off were performed on the back N surface, which is the second main surface of the GaN substrate, to form n-electrodes having square shapes when seen from above with each side having a width (D) of 200 microns (200 microns□) at the center of the chips at a pitch of a distance L2=2 mm (see FIG. 4 and FIG. 5). For the n-electrodes, a layered structure was formed in contact with the GaN substrate 1 with the following structure, starting from the bottom: (Ti layer 20 nm/Al layer 100 nm/Ti layer 20 nm/Au layer 200 nm). This was heated in a nitrogen (N2) atmosphere to obtain a contact resistance of no more than $1E-5\Omega \cdot cm^2$.

(S1-8) Then, reactive ion etching (RIE) was performed on the N surface of the substrate. As a result, multiple hemispherical projections were formed on the N surface by removing sections of the surface layer of the N layer. As shown in FIG. 4, the average value of the height T3 of the dome-shaped projections 82 was 30 microns and the width of the projections 82 was 60 microns. The specific conditions for the reactive ion etching process were as follows. First, the GaN substrate 1 was mounted in the processing container of the RIE device with the N surface facing up. Then, RIE processing was performed using the following process conditions: 20 mtorr of pressure inside the processing container; 300 W applied power; 100% chlorine ($Cl_2$) gas as the reaction gas; 50 sccm (standard cc/mm) (i.e., 0.05 liters/mm) as the flow of the chlorine gas serving as the reaction gas; and 120 minutes as the processing time. As a result, multiple hemispherical projections 82 were formed on the N surface of the substrate.

(S1-9) Then, as shown in FIG. 4 and FIG. 5, scribing was performed so that the chip boundaries 50 appeared as side surfaces, and the resulting chips formed light-emitting devices. In the light-emitting device chips, the light emission surface was 1.9 mm□ (a square with 1.9 mm sides), and the light-emitting layer was 1.9 mm□. More specifically, in FIG. 5, L1=1.9 mm and L2=2 mm. Also, the element separation groove width L3=100 microns and the width D of each side of the n-electrode=200 microns (the n-electrode is 200 microns□).

(S1-10) Referring to FIG. 1, the chip was mounted so that the p-type GaN layer side of the chip comes into contact with the lead frame mounting section 21a, resulting in the light-emitting device. The conductive adhesive 14 applied to the mounting section secures the light-emitting device and the mount and provides continuity.

(S1-11) In order to provide good dissipation of heat from the light-emitting device, the chip was mounted so that the entire surface of the p-type GaN layer of the light-emitting device comes into contact with the mounting section. Also, an Ag-based material, which has good heat conductivity, was used for the adhesive, and a CuW-based material, which has good heat conductivity, was used for the lead frame. As a result, the obtained heat resistance was 8 deg C/W.

(S1-12) Furthermore, the n-electrode and the lead section of the lead frame were connected using wire bonding, and an epoxy-based resin was used to seal the structure so that the light-emitting device formed a lamp.

(First comparative sample): The LED of the first comparative sample was equipped with essentially the same structure as the LED from the first invention sample, but the size of the hemispherical projections formed on the N surface of the GaN substrate 1 was different from that of the LED from the first invention sample. More specifically, in the LED of the first comparative sample, the average height of the hemispherical projections formed on the N surface of the GaN substrate 1 was 20 nm (0.02 microns), and the width of the projections was 40 nm (0.04 microns).

The method for making the LED of the first comparative sample was as follows.

(S2-1)-(S2-7): Essentially the same as (S1-1)-(S1-7) of the first invention sample.

(S2-8): Essentially similar to (S1-8) of the first invention sample, but the RIE process conditions are different. More specifically, the RIE processing time was 5 seconds. As a result, the average height of the hemispherical projections 82 was 20 nm (0.02 microns) and the width of the projections 82 was 40 nm (0.04 microns).

(S2-9)-(S2-12): Essentially the same as (S1-9)-(S1-12) of the first invention sample. In other words, the method for making the LED of the first comparative sample is essentially similar to the method for making the first invention sample, but the RIE processing time is different at the step (S2-8), which corresponds to the step (S1-8) of the first invention sample (the RIE processing time is shorter in the first comparative sample). As a result, the height and width of the formed projections 82 are less than the height and width of the first invention sample.

Figure 12:
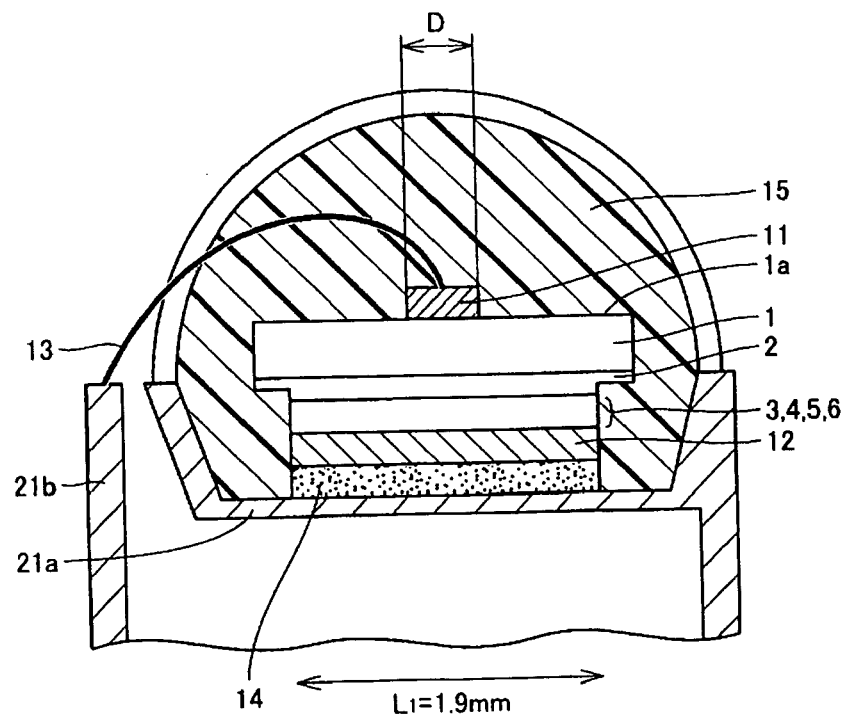
FIG. 12 is a simplified drawing showing a second comparative sample of an LED.

(Second comparative sample): The LED of the second comparative sample is equipped with essentially the same structure as the LED of the first comparative sample except that hemispherical projections are not formed on the N surface of the GaN substrate 1 as shown in FIG. 12. FIG. 12 is a simplified drawing of the LED of the second comparative sample.

The method for making the LED of the second comparative sample was as follows.

(S3-1)-(S3-7): Essentially the same as (S1-1)-(S1-7) of the first invention sample.

(S3-8)-(S3-11): Essentially the same as (S1-9)-(S1-12) of the first invention sample.

(Tests and Results)

The first invention sample and the first and second comparative samples were mounted in integrating spheres, a predetermined current (2 A) was applied and the resulting light was focused and light output from a detector were compared. As a result, the first invention sample provided an output of 1.1 W. The output from the first comparative sample was 0.8 W. The output from the second comparative sample was 0.8

W. Thus, the first invention sample, in which the hemispherical projections 82 having a predetermined size were formed by performing RIE on the light exit side (the second main surface side) of the GaN substrate, provided higher light output compared to the first and second comparative samples because of reasons such as relatively large contact boundary surface area between the GaN substrate 1 and the epoxy-based resin 15, the tendency for total internal reflection at the boundary surface to be prevented due to the boundary surface having various angles relative to the light-emitting surfaces, and the like.

Figure 13:
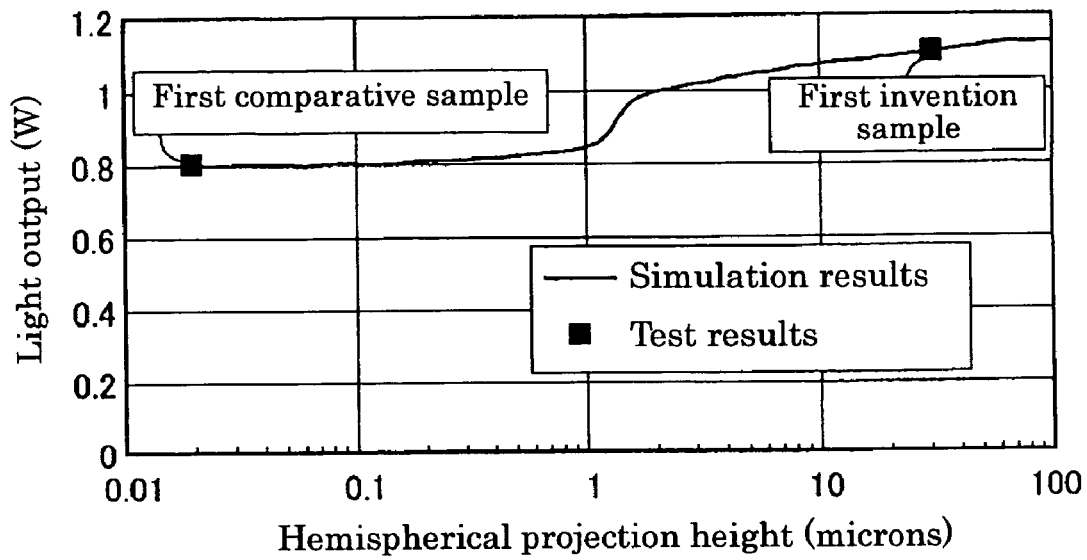
FIG. 13 is a graph showing the results determined from a simulation of the relationship between hemispherical projection height and light output.

The first invention sample and the first comparative sample described above differ only in the size of the hemispherical projections 82, and the relationship between the size (height) of the hemispherical projections 82 and the light output was determined through a simulation. The results are shown in FIG. 13. FIG. 13 is a graph showing the results from a simulation for determining the relationship between hemispherical projection height and light output. The horizontal axis of FIG. 13 indicates hemispherical projection height (unit: microns). The horizontal axis has a logarithmic scale. Also, the vertical axis of FIG. 13 indicates light output (unit: W). In FIG. 13, the test results for the first invention sample and the first comparative sample described above are indicated by black squares and the relationship between the hemispherical projection height and light output as determined from the simulation is indicated by a solid line. As shown in FIG. 13, the light output from the LED significantly improves when the height of the hemispherical projections 82 exceeds 1 micron.

Assumptions made in the simulation were that the essential structure of the LED was the same as that of the first invention sample and that all of the hemispherical projections (dome structures) formed together were hemispherical in shape. The height of the hemispherical projections was defined as the average height of the projections. The average height (and width) is determined by measuring the height (and width) for a predetermined number of projections and calculating the average value. More specifically, three random positions on the N surface of the substrate are studied at a predetermined magnification and five projections are selected randomly from the fields of view. Then, height and width data is measured for the 3 positions×5 projections=15 projections, and an average value is calculated for the height and width data. An average height and width for the projections can be obtained in this manner.

Second Example

In the second example of the present invention, the relationship between oxygen concentration of the GaN substrate and specific resistance and light transmittance was determined. Based on this relationship, it is possible to determine the relationship between optimal GaN substrate thickness and oxygen concentration for a predetermined light emission area in p-down mounting, i.e., a light-emitting device in which the GaN substrate is the light-emitting surface. Since, as described above, in p-down mounting, the light-emission surface is the GaN substrate, oxygen concentration, which is a major factor in specific resistance and light transmittance, is especially important.

Figure 14:
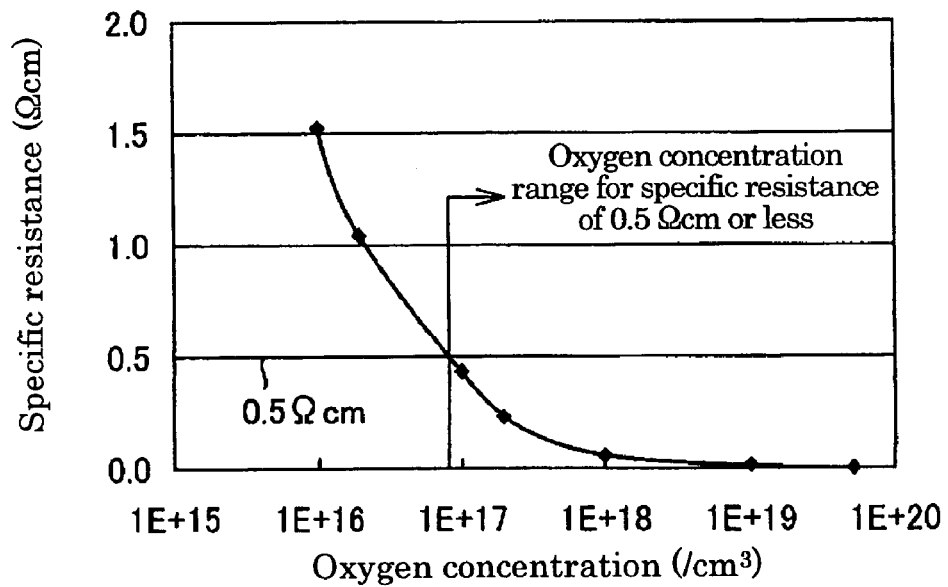
FIG. 14 is a drawing showing the effect of oxygen concentration to the specific resistance of a GaN substrate.
Figure 15:
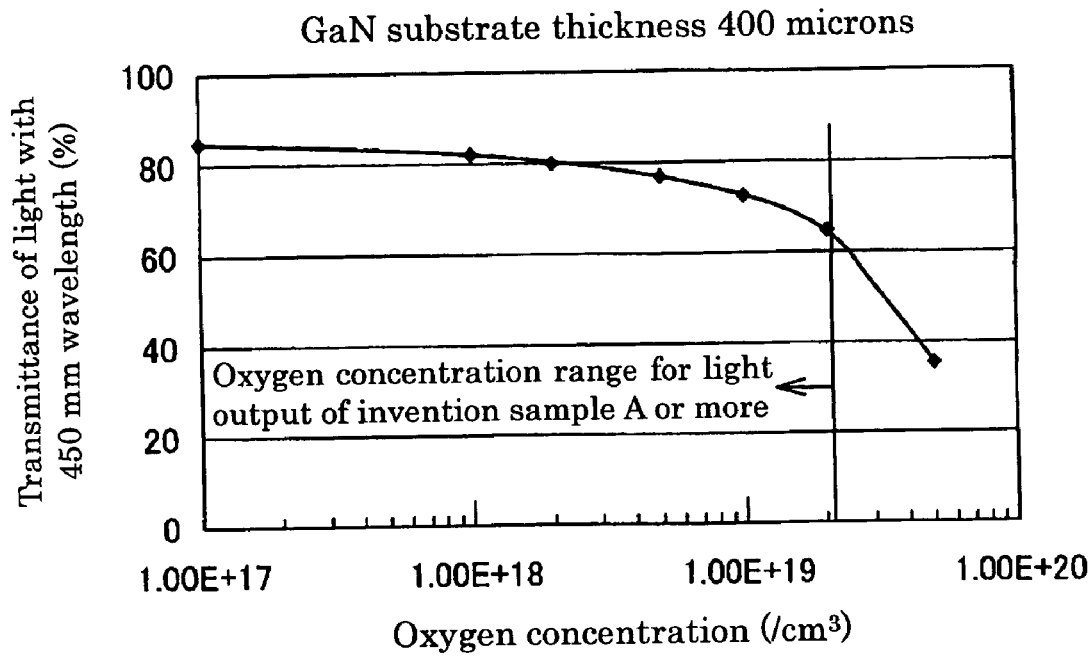
FIG. 15 is a drawing showing the effect of oxygen concentration on transmittance of light having a wavelength of 450 nm when the thickness of a GaN substrate is 400 microns.

FIG. 14 shows the effect of oxygen concentration on the specific resistance of the GaN substrate. Based on FIG. 14, a specific resistance of no more than 0.5 Ωcm can be achieved with an oxygen concentration of at least $1E17/cm^3$. Also, FIG. 15 shows the effect of oxygen concentration on the transmittance of light at a wavelength of 450 nm when the thickness of the GaN substrate is 400 microns. If the oxygen concentration exceeds $2E19/cm^3$, it can be seen that the transmittance of the light with wavelength 450 nm decreases suddenly. FIG. 14 and FIG. 15 show that increasing oxygen concentration reduces the specific resistance of the GaN substrate and enlarges the light-emission surface but reduces the transmittance of the light. Thus, in GaN substrates used in light-emitting devices that are p-down mounted, the oxygen concentration, the thickness of the GaN substrate, and the plane size of light emission is extremely important.

Figure 16:
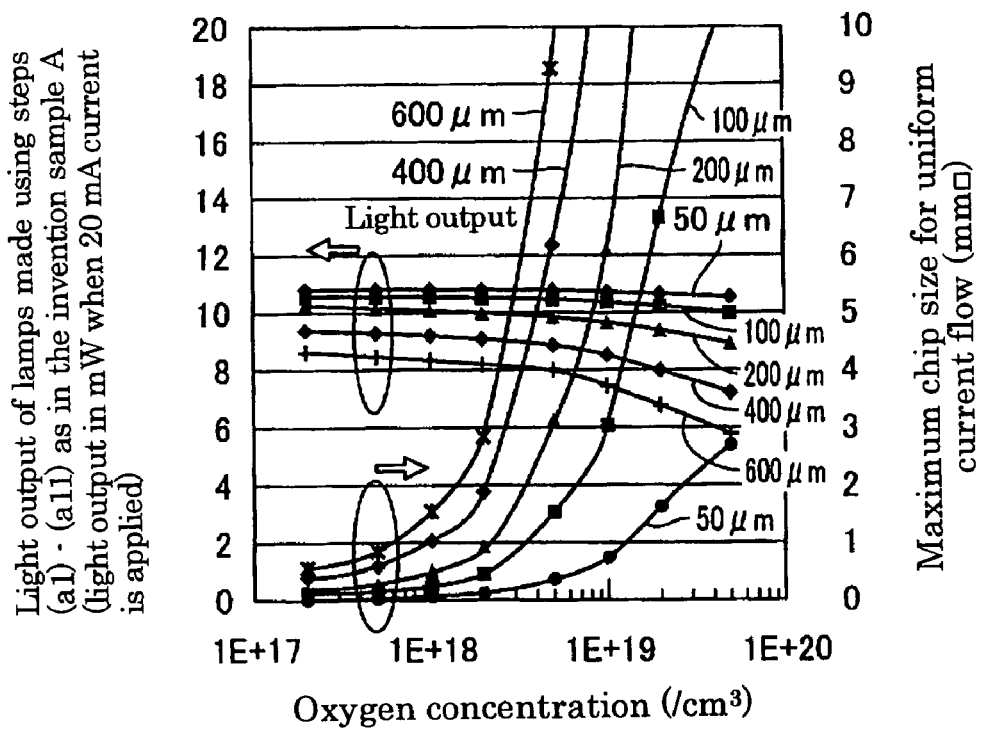
FIG. 16 is a drawing showing, for the LED according to the present invention as shown in FIG. 1, the results of measurements of lamp light output and plane size through which current flows uniformly when lamps are made from GaN substrates with different thicknesses and oxygen concentrations.

FIG. 16 shows, for the LED according to the present invention shown in FIG. 1, the results of measuring light output and the plane size through which current flows uniformly when lamps are made from GaN substrates with different thicknesses and oxygen concentrations. The LED was made using steps essentially the same as those of the first invention sample described above.

As can be seen from FIG. 16, in terms of the light output from the lamp, light output tends to decrease as the thickness increases or the oxygen content increases. Also, in terms of the maximum plane size through which current flows uniformly, the value tends to increase as the thickness increases or the oxygen concentration increases.

Referring to FIG. 16, if the plane size through which current uniformly flows is a square with 4 mm sides (5 mm sides), for a GaN substrate with a thickness of 200 microns, an oxygen concentration of at least $6E18/cm^3$ (at least $8E18/cm^3$ for a square with 5 mm sides) will provide light output of at least 8 mW when 20 mA is applied to the LED of the present invention when the LED has a light emission surface of 300 microns□ (a square with 300 micron sides) and the light emission layer is 300 microns□. In other words, for an LED of the present invention that is a 300 micron square, when current density is adjusted to the application of 20 mA, this corresponds to the application of 3.6 A (5.6 A) for a square with 4 mm sides (5 mm sides), and uniform light output can be obtained with a light output of at least 1.4 W (2.3 W) proportional to the applied current of 3.6 A (5.6 A).

For the same target performance as the 200 micron thickness example, in a 400 micron thickness GaN substrate, an oxygen concentration of at least $3E18/cm^3$ for a square with 4 mm sides can be used (an oxygen concentration of at least $4E18/cm^3$ for a square with 5 mm sides). However, at 400 micron thickness, optical output corresponding to at least 8 mW when 20 mA is applied to the LED of the present invention with the size described above can be obtained only when the oxygen thickness is no more than $2E19/cm^3$.

Furthermore, with a GaN substrate with a thickness of 600 microns, the limiting value for the oxygen concentration that provides at least 8 mW optical output for 20 mA with the LED of the present invention with the size described above is a value only slightly higher than $2.5E18/cm^3$, which is the oxygen concentration for uniform current flow in a square with 4 mm sides. Thus, the oxygen concentration range that meets the above two conditions is a narrow range. For a square with 3 mm sides, the oxygen concentration for uniform current flow is at least approximately $2E18/cm^3$, so the oxygen concentration tolerance range is slightly greater compared to that of the square with 4 mm sides.

Also, according to FIG. 16, when the thickness of the GaN substrate is 200 microns-400 microns, it can be seen that for allowing current to flow uniformly in a square with 10 mm sides and obtain the equivalent of at least 8 mW of output when 20 mA is applied with the LED of the present invention with the size described above, the oxygen concentration range is adequately wide for practical use. It can be seen that at a thickness of 200 microns, this is possible for an oxygen content with a lower limit that is less than $2E19/cm^3$. Also, at a thickness of 400 microns, this is possible with an oxygen content of at least $8E18/cm^3$.

Next, although there may be overlap with the examples described above, the examples of the present invention will be summarized below.

As shown in FIG. 1 and FIG. 6, a light-emitting device according to the present invention is equipped with a nitride semiconductor substrate (the GaN substrate 1); an n-type nitride semiconductor layer (the n-type $Al_xGa_{1-x}N$ layer 3) on the first main surface side of the nitride semiconductor substrate; a p-type semiconductor layer (the p-type $Al_xGa_{1-x}N$ layer 5) positioned further away from the nitride semiconductor substrate relative to the n-type nitride semiconductor layer; and a light-emission layer (multi-quantum well (MQW 4)) positioned between the n-type nitride semiconductor layer and the p-type nitride semiconductor layer. In this light-emitting device, the p-type nitride semiconductor layer side is down-mounted, and light is emitted from the second main surface 1a, which is the main surface opposite from the first main surface of the nitride semiconductor substrate. Hemispherical projections 82 are formed on the second main surface 1a of the nitride semiconductor substrate.

With this structure, since hemispherical projections 82 are formed on the second main surface 1a, which is the light exit surface of the nitride semiconductor substrate, the lens effect of the projections 82 makes it possible to efficiently extract light in the direction perpendicular to the second main surface 1a. As a result, the light usage efficiency of the light-emitting device can be improved compared to when no projections 82 are formed, when a non-specular finish is simply applied to the second main surface 1a using a KOH solution or the like, or when dicing or the like is performed to form a groove on the second main surface 1a.

Also, in the structure described above, the n-electrode 11 is disposed on the back surface (the second main surface) of the nitride semiconductor substrate (the GaN substrate 1), which has a low electrical resistance, current is able to flow throughout the nitride semiconductor substrate even when the cover ratio is low, i.e., the opening ratio is high for the n-electrode 11. As a result, the proportion of light absorbed at the emission surface can be reduced and the light emission efficiency can be increased. Of course, the emission of light can take place not only from the second main surface but also from the side surface. The same applies to the light emitting devices described below.

Also, since the p-type nitride semiconductor layer side, which has a high electrical resistance, is not used as a light emission surface, the p-type electrode layer (the p-electrode 12) can be formed over the entire surface of the p-type nitride semiconductor layer, thus providing a structure that is advantageous for using high currents while limiting heat generation as well as transferring generated heat. Thus, restrictions imposed by heat-related factors are significantly relaxed. As a result, there is no need to use a comb-shape with interleaved p-electrodes and n-electrodes or the like in order to reduce the electrical resistance.

Furthermore, since the GaN substrate 1 has superior conductivity, there is no need to provide a special protection circuit for surge voltages, while superior high-voltage resistance is provided. Also, since complex processing steps are not necessary, production costs can be easily reduced.

In the light-emitting device described above, the nitride semiconductor substrate can be formed from GaN or $Al_xGa_{1-x}N$ ($0<=x<=1$). If the GaN substrate 1 is used as the nitride semiconductor substrate, a high current density can be applied to the substrate, making it possible to emit high luminance (high luminous flux) from the light-emitting device.

Also, if GaN or $Al_xGa_{1-x}N$ ($0<=x<=1$) is used to form the nitride semiconductor substrate, an LED light-emitting device can be formed using a nitride semiconductor substrate with good heat conductivity, i.e., superior heat dissipation. As a result, adequate heat dissipation is possible even when high current density is applied, thus making it possible to reduce damage to the LED caused by heat. This makes it possible to achieve a light-emitting device that can output stable light over a long period of time.

In the light-emitting device described above, the nitride semiconductor substrate can be the GaN substrate 1. The GaN substrate 1 is n-typed through oxygen doping and the oxygen concentration can be at least $1E17$ ($1\times10^{17}$)/$cm^3$, and no more than $2E19$ ($2\times10^{19}$)/$cm^3$. In this case, current flows uniformly through the GaN substrate 1 so that adequate light can be emitted from roughly the entire second main surface of the GaN substrate 1.

In the light-emitting device described above, the height T3 (see FIG. 4) of the hemispherical projections 82 can be at least 0.2 microns and no more than 100 microns, and the thickness T2 (see FIG. 4) of the sections not formed with the projections 82 along the thickness axis of the nitride semiconductor substrate (the GaN substrate 1) can be at least 100 microns and no more than 600 microns. Also, the width (W) (see FIG. 4) of the projections 82 can be approximately double the height T3 of the projections 82, and more specifically at least 0.4 microns and no more than 200 microns. Also, the height T2 and the width W of the projections 82 can be the average height and the average width of the projections 82. Average height and average width can be determined, for example, by measuring the height and width of a predetermined number of projections and calculating the averages. More specifically, height and width can be measured for five randomly selected projections in the fields of view for three random points on the N surface of the substrate when observed at a predetermined magnification. Height and width data are measured for these 3×5=15 projections and the average height and width can be determined by calculating the average values for the height and width data.

Regarding fresnel reflections of light, the advantages of the structure of the nitride semiconductor substrate (the GaN substrate 1) appear and light extraction efficiency improves generally when the size of the structure is at least approximately (wavelength of light to be extracted: λ)/(index of refraction of the nitride semiconductor substrate: n). Assuming the wavelength of the light to be extracted from the light-emitting device is 420 nm-480 nm and the nitride semiconductor substrate is the GaN substrate 1, the index of refraction of the GaN substrate 1 is 2.5. Based on this data, we determine the lower limit of the size of the structure at which light extraction efficiency improves. As a result, it is believed that if the size of the structure is at least 0.2 microns (200 nm), the advantages of the structure come into effect, and the light extraction efficiency from the second main surface 1a, which is the light extraction surface, improves. Also, while larger structures show greater optical extraction efficiency, if the size (e.g., the height T3) of the structure (the projections 82) become too large, formation of the projections 82 becomes time-consuming. When the formation of the projections 82 becomes time-consuming, the production period of the light-emitting device is increased, ultimately increasing the production costs of the light-emitting device. As a result, a value of approximately 100 microns can be considered as a size (height) for the projections 82 that can be formed within a practical processing period. Also, since the width W of the projections 82 will be approximately twice the height, the width W will be at least 0.4 microns and no more than 200 microns.

Also, regarding the thickness of the nitride semiconductor substrate at the sections where the projections 82 are not formed (the thickness T2 at the thinnest sections of the GaN substrate 1 between adjacent projections 82), it is necessary to provide adequate thickness to allow current supply to the light-emitting layer (the MQW 4) to flow (i.e., if the thickness T1 of the GaN substrate 1 (see FIG. 4) is too thin, the current supplied from the n-electrode 11 installed on the second main surface 1a side does not flow adequately through the entire surface of the light-emitting layer, thus preventing light from being emitted efficiently from the entire surface of the light-emitting layer). Thus, in order to provide adequate flow of the current supplied to the GaN substrate, it would be preferable for the thickness T1 of the nitride semiconductor substrate at the sections on which the projections 82 are not formed to be at least 100 microns.

In order to form the projections 82 as large as possible, a greater thickness T1 for the GaN substrate 1 would be effective. However, if the thickness T1 of the GaN substrate 1 is too great, the transmittance of the GaN substrate 1 for the light transmitted through the GaN substrate 1 and emitted from the second main surface 1a becomes too low. Also, as the GaN substrate 1 becomes thicker, the material costs for the GaN substrate 1, ultimately resulting in greater production costs for the light-emitting device. Taking these factors into account, an upper limit of approximately 600 microns for the thickness T2 of the GaN substrate 1 at the sections on which the projections 82 are not formed would keep the problems relating to light transmittance and production costs within an acceptable range.

In the light-emitting device described above, it would be preferable for the height T3 of the hemispherical projections 82 to be at least 1 micron and more preferably 2 microns. Also, it would be preferable for the height T3 of the projections 82 to be no more than 80 microns.

If the light to be extracted from the light-emitting device is blue light, the present inventor has determined that a height of at least 1 micron for the projections 82 significantly improves light extraction efficiency. As a result, it would be preferable for the height of the projections 82 to be at least 1 micron. Also, if the height of the projections 82 is at least 2 microns, it is possible to reliably improve light extraction efficiency.

In the light-emitting device described above, the projections 82 can be formed on the second main surface 1a using reactive ion etching. Thus, the projections 82 can be formed using reactive ion etching without requiring dicing or abrasion. As a result, the production steps for the light-emitting device can be simplified compared to when dicing or the like is performed. This makes it possible to reduce production costs for the light-emitting device.

A method for making a light-emitting device equipped with a nitride semiconductor substrate according to the present invention includes: a step for preparing a nitride semiconductor substrate (substrate preparation step (S10)); and a step for forming hemispherical projections (RIE hemispherical projection formation step (S20)). In the hemispherical projection formation step (S20), the hemispherical projections 82 are formed by removing sections of the second main surface 1a by performing reactive ion etching on the second main surface 1a of the nitride semiconductor substrate (the GaN substrate 1) opposite from the first main surface on the side where the light-emitting layer is formed.

This makes it possible to form the projections 82 with reactive ion etching without requiring dicing or abrasion or the like. This makes it possible to simplify the production steps for the light-emitting device compared to performing dicing or the like, thus making it possible to make the light-emitting device of the present invention at a low cost.

In the nitride semiconductor substrate (the GaN substrate 1) according to the present invention, the hemispherical projections 82 are formed on a single main surface (the second main surface 1a). In this case, using the nitride semiconductor substrate (the GaN substrate 1) to make the light-emitting device and using the surface on which the projections 82 are formed as the light-extraction surface of the light-emitting device, it is possible to make a light-emitting device with higher light extraction efficiency compared to using a substrate on which the projections 82 are not formed.

The nitride semiconductor substrate can be the GaN substrate 1. The GaN substrate 1 is n-typed through oxygen doping, and it would be preferable for the oxygen concentration to be at least 1E17 oxygen atoms/cm$^3$ and no more than 2E19 atoms/cm$^3$. In this case, since current can flow uniformly through the entire GaN substrate 1, adequate light can be emitted from roughly the entire second main surface of the GaN substrate 1 in the light-emitting device made using the GaN substrate 1.

Regarding the oxygen concentration in the GaN substrate 1 serving as the nitride semiconductor substrate, if the concentration exceeds 2E19 atoms/cm$^3$, the transmittance for light (especially blue light) of the GaN substrate 1 is reduced, ultimately resulting in a low light transmittance for the GaN substrate 1. Also, if the oxygen concentration of the GaN substrate 1 is less than 1E17 atoms/cm$^3$, the specific resistance of the GaN substrate 1 is lowered so that the current supplied from the GaN substrate 1 to the electrodes is not supplied with adequate uniformity to the light-emitting layer 4. As a result, the light output from the light-emitting device is lower.

In the nitride semiconductor substrate, the height of the hemispherical projections 82 can be at least 0.2 microns and no more than 100 microns. Regarding the thickness of the nitride semiconductor substrate, the thickness T2 (see FIG. 4) at the sections at which the projections 82 are not formed can be at least 100 microns and no more than 600 microns. Also, the width W (see FIG. 4) of the projections 82 can be approximately twice the height T3 (see FIG. 4) of the projections 82, and, more specifically, can be at least 0.4 microns and no more than 200 microns.

In this case, the advantages of the structure of the projections 82 come into effect and the light extraction efficiency can be improved in the light-emitting device that uses the surface on which the projections 82 are formed as the light-extraction surface. If the height of the projections is at least 0.2 microns as described above, the advantages of the structure of the projections 82 can come into effect. Also, if the height T3 of the projections 82 is no more than 100 microns, the processing time for the reactive ion etching used to form the projections 82 will be in a practical range.

Also, if, when the thickness T2 of the nitride semiconductor substrate at the sections where the projections 82 are not formed is at least 100 microns, the light-emitting device is made using a nitride semiconductor substrate, current can be supplied through the substrate so that it flows through the entire light-emitting layer (the MQW 4) of the light-emitting device. Also, if the thickness T2 at the sections on which the projections 82 are not formed is no more than 600 microns, the problem relating to the reduction in light transmittance in the substrate can be restricted.

In the nitride semiconductor substrate described above, it would be preferable for the height T3 of the hemispherical projections 82 to be at least 1 micron and more preferably 2 microns. Also, it would be preferable for the height T3 of the projections 82 to be more preferably no more than 80 microns.

When the light-emitting device is made using the GaN substrate 1, if the height T3 of the projections 82 is at least 1 micron, the light extraction efficiency of the surface (the second main surface 1a) on which the projections 82 are formed can be significantly improved compared to when the projections 82 are not formed. Also, if the height T3 of the projections 82 is at least 2 microns, the improvement in the light extraction efficiency will be provided reliably.

In the nitride semiconductor substrate described above, the projections 82 can be formed on the second main surface 1a through reactive ion etching. In this case, the projections 82 can be formed through reactive ion etching without requiring dicing or abrasion or the like. As a result, the production steps for the nitride semiconductor substrate is simplified compared to when dicing or the like is performed.

The above description presented embodiments and examples of the present invention but the above embodiments and examples of the present invention are simply examples and the scope of the present invention is not restricted to these embodiments of the invention. The scope of the invention is indicated by the scope of the claims and also encompasses the scope of equivalences with the claims.

In the light-emitting device of the present invention, a nitride semiconductor substrate with high conductivity is used, hemispherical projections are formed on the light-emission surface, and p-down mounting is performed. As a result: (1) light extraction efficiency can be improved; (2) high-output light emission is possible with superior heat dissipation and without requiring complex electrode structures; (3) superior conductivity is provided and large-area light emission and superior static voltage resistance is provided without requiring a protection circuit for protecting the light-emitting element from transient voltages and static discharge; (4) since there are no significant discontinuities from high index of refraction to low index of refraction going from the light-emitting layer to the substrate, total internal reflection tends not to occur between the light-emitting element and the emission surface, thus preventing reduced efficiency and resin degradation of the side surface resulting from total internal reflection; (5) since light is emitted at low voltages, there is no need for high-capacity power supplies, making the structure especially suited for automotive illumination devices; (6) the simple structure makes production easy and inexpensive and easy to maintain as well. As a result, it is expected that the present invention will be used over a broad range of illumination products, including automotive illumination devices.

What is claimed is:

1. A light-emitting device comprising:
   a nitride semiconductor substrate;
   an n-type nitride semiconductor layer disposed on a first primary surface side of said nitride semiconductor substrate;
   a p-type nitride semiconductor layer positioned further away from said nitride semiconductor substrate compared to said n-type nitride semiconductor layer; and
   a light-emitting layer positioned between said n-type nitride semiconductor layer and said p-type nitride semiconductor layer, wherein
   said p-type nitride semiconductor layer side is down-mounted and light is emitted from a second main surface of said nitride semiconductor substrate, which is a main surface opposite from said first main surface;
   a plurality of hemispherical projections are formed on said second main surface of said nitride semiconductor substrate, said hemispherical projections having a height of at least 0.2 microns and no more than 100 microns; and
   along a thickness axis of said nitride semiconductor substrate, sections on which said projections are not formed have a thickness of at least 100 microns and no more than 600 microns.

2. A light-emitting device as in claim 1 wherein said nitride semiconductor substrate is a GaN substrate; and said GaN substrate is n-typed through oxygen doping, and oxygen concentration is at least 1E17 atoms/cm$^3$ and no more than 2E19 atoms/cm$^3$.

3. A light-emitting device as in claim 1 wherein said projections are formed on said second main surface by performing reactive ion etching.

4. A light-emitting device as in claim 1 wherein said hemispherical projections having an average height between 30 microns and 100 microns, and have an average width between 60 microns and 200 microns.

* * * * *